(12) United States Patent
Maezono et al.

(10) Patent No.: US 9,961,820 B2
(45) Date of Patent: May 1, 2018

(54) COMPONENT REPLENISHMENT SUPPORT METHOD AND COMPONENT REPLENISHMENT SUPPORT SYSTEM IN COMPONENT MOUNTING LINE

(71) Applicant: Panasonic Intellectual Property Management Co., Ltd., Osaka (JP)

(72) Inventors: Hisashi Maezono, Yamanashi (JP); Hideki Sumi, Yamanashi (JP); Yasuhiro Maenishi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 213 days.

(21) Appl. No.: 15/140,092

(22) Filed: Apr. 27, 2016

(65) Prior Publication Data

US 2016/0353624 A1 Dec. 1, 2016

(30) Foreign Application Priority Data

May 28, 2015 (JP) ................................ 2015-108251

(51) Int. Cl.
- *H05K 3/30* (2006.01)
- *B23P 19/00* (2006.01)
- *H05K 13/08* (2006.01)
- *H05K 13/04* (2006.01)

(52) U.S. Cl.
CPC ......... *H05K 13/08* (2013.01); *H05K 13/0417* (2013.01); *Y10T 29/4913* (2015.01); *Y10T 29/53174* (2015.01)

(58) Field of Classification Search
CPC .... H05K 13/08; H05K 3/301; Y10T 29/4913; Y10T 29/53174; Y10T 29/53261
USPC ...... 29/832, 564.1, 711, 720, 739, 740, 759, 29/833, 836
See application file for complete search history.

(56) References Cited

U.S. PATENT DOCUMENTS

| | | | |
|---|---|---|---|
| 2004/0130863 A1* | 7/2004 | Shimizu | H05K 13/0417 361/679.01 |
| 2015/0052745 A1* | 2/2015 | Kurata | H05K 13/08 29/832 |

FOREIGN PATENT DOCUMENTS

JP 2002-164697 6/2002

* cited by examiner

*Primary Examiner* — Thiem Phan
(74) *Attorney, Agent, or Firm* — Pearne & Gordon LLP

(57) ABSTRACT

Provided are a component replenishment support method, and a component replenishment support system of a component mounting line that are capable of preventing a decrease in facility operation rate due to component shortage, in which a component shortage time of each part feeder is predicted, a component replenishment work is started from the present time in a case where the component shortage time is earlier than the virtual work end time, a virtual work end time of the work target selection feeders in a case where the work is assumed to be performed in sequence of early time by using the part feeder within the warning consideration start time as a target is predicted, and a worker is warned of a man-hour lack to the selection feeder, in a case where the selection feeder of which the component shortage time is earlier than the work end time is present.

8 Claims, 13 Drawing Sheets

FIG. 6

|             | Worker a | Worker b | Worker c | Worker d |
|-------------|----------|----------|----------|----------|
| Proficiency | 5        | 1        | 3        | 3        | ← 34a
| Charge line | L1       | L1       | L2       | L2       | ← 34b
| Work time   | 1 minute | 5 minute | 3 minute | 3 minute | ← 34c

COMPONENT REPLENISHMENT SUPPORT METHOD AND COMPONENT REPLENISHMENT SUPPORT SYSTEM IN COMPONENT MOUNTING LINE

BACKGROUND OF THE INVENTION

1. Field of the Invention

The present invention relates to a component replenishment support method, and a component replenishment support system in a component mounting line including a component mounting apparatus that mounts a component on a substrate.

2. Description of the Related Art

A component mounting line for manufacturing a mounted substrate by mounting a component on a substrate is configured by connecting a plurality of component mounting apparatuses to each other. In each component mounting apparatus, component mounting work of transport and mounting the component on the substrate by pulling out the component from a part feeder installed on a component supplier is repeatedly executed. In a process of continuously executing the component mounting work, component replenishment work of replenishing a new component to the part feeder in combination with the timing when component shortage is caused by consuming the component is repeatedly executed. In order to execute the component replenishment work at the suitable timing, a countermeasure such as notification of occurrence time of the component shortage which is predicted in advance by simulation calculation is used (for example, see PTL 1).

An example of the related art illustrated in PTL 1 discloses that a component shortage notice time is calculated in real time from the number of replenished components, and consumption information of the component from the component mounting apparatus, and the component shortage notice time is displayed to a portable device which is carried by a worker by rearranging the component shortage notice time in sequence. The worker carries out the component replenishment work by considering a plan such as the replenished timing; based on the displayed component shortage notice time and his/her own experience.

CITATION LIST

Patent Literature

PTL 1; Japanese Patent Unexamined Publication No. 2002-164697

SUMMARY OF THE INVENTION

According to an exemplary embodiment of the present invention, there is provided a component replenishment support method in a component mounting line including a component mounting apparatus that mounts a component on a substrate by pulling out the component which is supplied from a plurality of part feeders. The method includes a component shortage time prediction step, a selection step, a first work end time prediction step, a second work end time prediction step, and a first warning step. The component shortage time prediction step is a step of predicting a component shortage time of each of the plurality of part feeders. The selection step is a step of selecting the part feeder of which the component shortage time exceeds a predetermined warning start time, and is within a warning consideration start time preceding the warning start time as at least one selection feeder, from the plurality of part feeders. The first work end time prediction step is a step of starting component replenishment work from the later time of either a time of a case where the component replenishment work is ended in all part feeders of which the component shortage time is within the warning start time by starting the component replenishment work from the present time, or an overtime of a case where the component shortage time of any of the at least one selection feeder exceeds a time at which the component shortage time firstly reaches the warning start time, and predicting a first component replenishment work end time of the at least one selection feeder in a case where the component replenishment work is assumed to be performed in sequence of early component shortage time by using the at least one selection feeder as a target. The second work end time prediction step is a step of starting component replenishment work from the present time in a case where the at least one selection feeder of which the component shortage time is earlier than the first component replenishment work end time is present, and predicting a second component replenishment work end time of the at least one selection feeder in a case where the component replenishment work is assumed to be performed in sequence of early component shortage time by using the part feeder of which the component shortage time is within the warning consideration start time as a target. The first warning step is a step of warning a man-hour lack to the at least one selection feeder, in a case where the at least one selection feeder of which the component shortage time is earlier than the second component replenishment work end time is present.

According to another exemplary embodiment of the present invention, there is provided a component replenishment support system in a component mounting line including a component mounting apparatus that mounts a component on a substrate by pulling out the component which is supplied from a plurality of part feeders. The system includes a component shortage time predictor, a selector, a first work end time predictor, a second work end time predictor, and a first warner. The component shortage time predictor predicts a component shortage time of each of the plurality of part feeders. The selector selects the part feeder of which the component shortage time exceeds a predetermined warning start time, and is within a warning consideration start time preceding the warning start time as at least one selection feeder, from the plurality of part feeders. The first work end time predictor starts component replenishment work from the later time of either a time of a case where the component replenishment work is ended in all part feeders of which the component shortage time is within the warning start time by starting the component replenishment work from the present time, or an overtime of a case where the component shortage time of any of the at least one selection feeder exceeds a time at which the component shortage time firstly reaches the warning start time, and predicts a first component replenishment work end time of the at least one selection feeder in a case where the component replenishment work is assumed to be performed in sequence of early component shortage time by using the at least one selection feeder as a target. The second work end time predictor starts component replenishment work from the present time in a case where the at least one selection feeder of which the component shortage time is earlier than the first component replenishment work end time is present, and predicts a second component replenishment work end time of the at least one selection feeder in a case where the component replenishment work is assumed to be performed in sequence of early component shortage time by using the part feeder of which the component shortage time is within the warning consideration start time as a target. The first warner warns a man-hour lack to the at least one selection feeder, in a case where the at least one selection feeder of which the component shortage time is earlier than the second component replenishment work end time is present.

According to the exemplary embodiments of the present invention, it is possible to prevent a decrease in facility operation rate due to occurrence of component shortage in the component mounting line.

BRIEF DESCRIPTION OF DRAWINGS

FIG. 6 is a diagram illustrating worker data in the component mounting line according to the exemplary embodiment of the present invention;

DETAILED DESCRIPTION OF THE PREFERRED EMBODIMENTS

Before describing exemplary embodiments of the present invention, problems in a system of the related art will be briefly described. In the related art including PTL 1, there are problems in which since determination of the component replenishment is entrusted to the worker, the worker may not notice an amount (man-hour lack) of the work that may not be completed even when the component replenishment work is smoothly carried out, a facility operation rate may be lowered by occurrence of an apparatus stop due to the component shortage without the component replenishment work performed in time.

An object of the present invention is to provide a component replenishment support method, and a component replenishment support system in a component mounting line that are capable of preventing a decrease in facility operation rate due to occurrence of component shortage in the component mounting line.

Figure 1:
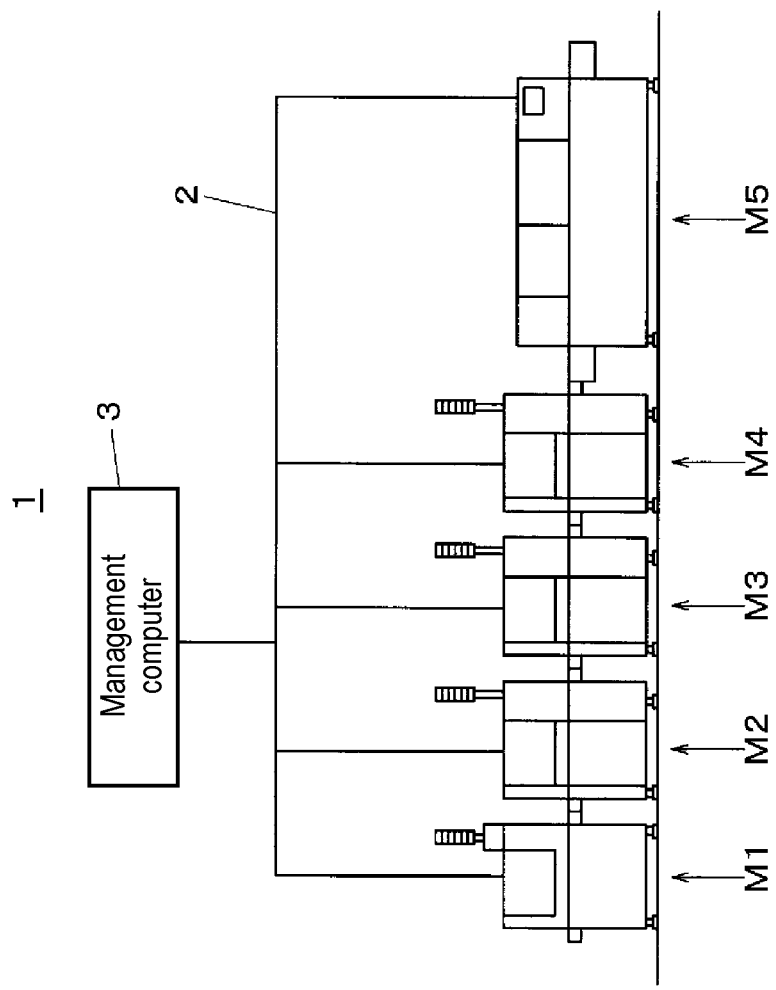
FIG. 1 is a diagram illustrating a configuration of a component mounting line according to an exemplary embodiment of the present invention.

Next, exemplary embodiments of the present invention will be described with reference to the drawings. First, a component mounting line will be described with reference to FIG. 1. In FIG. 1, component mounting line 1 has a function for manufacturing a mounted substrate by mounting a component on a substrate, and has a configuration in which printing apparatus M1, component mounting apparatuses M2 to M4, and reflow apparatus M5 are connected through communication network 2 by connecting the apparatuses to each other, and the whole is controlled by management computer 3.

Printing apparatus M1 performs screen printing of paste-shaped solder in an electrode for component bonding which is formed on the substrate. Component mounting apparatuses M2 to M4 perform component mounting work of the transport and mounting the component on the substrate by pulling out the component by a mounting head from a part feeder arranged in a component supplier. Thereafter, the substrate on which the component is mounted is sent to reflow apparatus M5, and the mounted substrate is manufactured by performing solder bonding of the component which is mounted on the substrate to the substrate. In this manner, component mounting line 1 includes component mounting apparatuses M2 to M4 that mount the component on the substrate by pulling out the component supplied from each part feeder.

Next, configurations of component mounting apparatuses M2 to M4 will be described with reference to FIG. 2 and FIG. 3. FIG. 3 partially illustrates a cross section taken along III-III line in FIG. 2. Hereinafter, a substrate transport direction (left and right direction of paper in FIG. 2) is defined as an X direction, and a direction orthogonal to the X direction in a horizontal plane (up and down direction of paper in FIG. 2) is defined as a Y direction, and a direction perpendicular to the horizontal plane (up and down direction of paper in FIG. 3) is defined as a Z direction.

Figure 2:
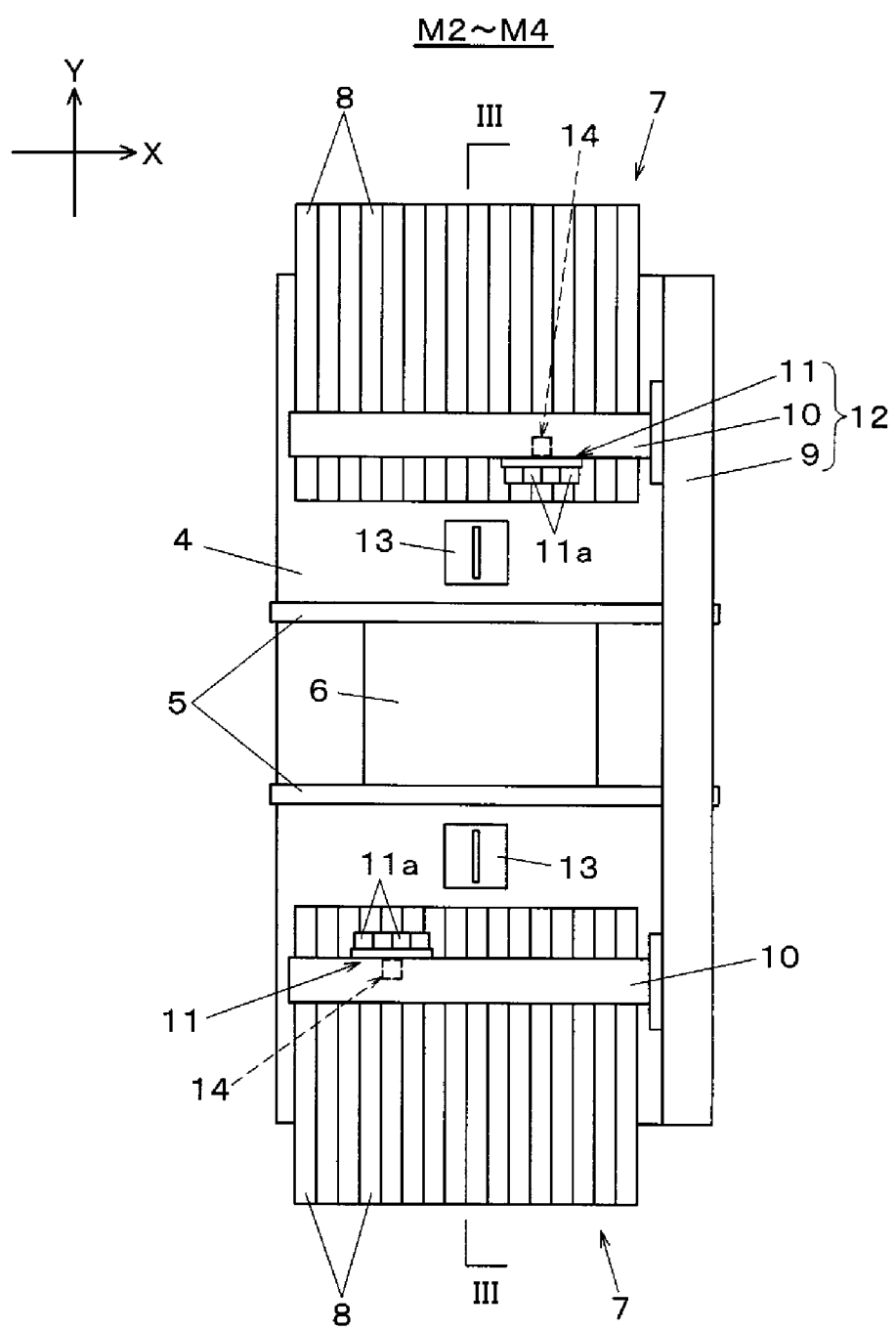
FIG. 2 is a plan view of a component mounting apparatus according to an exemplary embodiment of the present invention.
Figure 3:
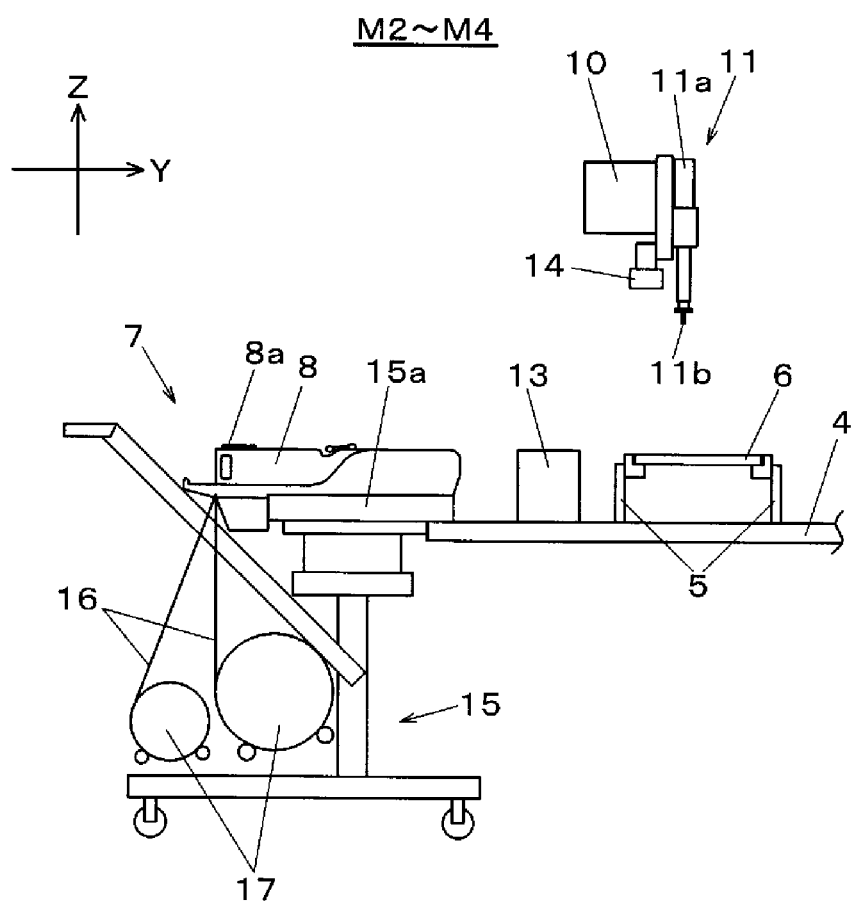
FIG. 3 is a sectional view of a portion of the component mounting apparatus according to the exemplary embodiment of the present invention.

In FIG. 2, substrate transport mechanism 5 is disposed at the center of base 4 in the X direction. Substrate transport mechanism 5 transports substrate 6 which is carried from an upstream side, and retains substrate 6 by positioning substrate 6 on a mounting stage which is set in order to execute the component mounting work. Component supplier 7 is disposed on both sides of substrate transport mechanism 5, and a plurality of tape feeders 8 are installed in parallel on each of component supplier 7. Tape feeder 8 supplies the component to a component adsorption position depending on a mounting head of a component mounting mechanism described below, by performing pitch feeding of a carrier tape accommodating the component in a tape feeding direction.

Y-axis beam 9 including a linear drive mechanism is disposed at one end of an upper surface of base 4 in the X direction. Two X-axis beams 10 similarly including linear drive mechanisms are movably coupled to Y-axis beam 9 in the Y direction. In each of two X-axis beams 10, mounting head 11 is movably installed in the X direction. Mounting head 11 is a multiple head including a plurality of retaining heads 11a, and adsorption nozzle 1 lb that retains the component by adsorbing the component, and is capable of individually rising and falling is installed at a lower end of each retaining head 11a, as illustrated in FIG. 3.

By driving Y-axis beam 9 and X-axis beam 10, mounting head 11 is moved in the X direction and the Y direction. Thereby, two mounting heads 11 pulls out the component by adsorbing and retaining the component by adsorption nozzle llb from the component adsorption position of tape feeder 8 disposed in component supplier 7 corresponding to each thereof, and transports and mounts the component at a mounting point of substrate 6 which is positioned in substrate transport mechanism 5. Y-axis beam 9, X-axis beam 10, and mounting head 11 configure component mounting mechanism 12 that transports and mounts the component on substrate 6, by moving mounting head 11 which retains the component.

Between component supplier 7 and substrate transport mechanism 5, component recognition camera 13 is disposed. When mounting head 11 pulling out the component from component supplier 7 is moved above component recognition camera 13, component recognition camera 13 recognizes the component by capturing an image of the component in a state of being retained in mounting head 11. On a lower surface of X-axis beam 10, each of substrate recognition camera 14 that is moved integrally with mounting head 11 are installed.

By moving mounting head 11, substrate recognition camera 14 is moved above substrate 6 which is positioned in substrate transport mechanism 5, and recognizes a substrate mark by capturing an image of the substrate mark (not illustrated) which is formed on the substrate 6. In the component mounting work of substrate 6 by mounting head 11, a mounting position correction is performed by adding a recognition result of the component depending on component recognition camera 13 to a recognition result of the substrate mark depending on substrate recognition camera 14.

As illustrated in FIG. 3, carriage 15 of a state where the plurality of tape feeders 8 are installed in advance on feeder base 15a is set to component supplier 7. Feeder addresses for specifying the feeder positions in which individual tape feeders 8 are installed are set to feeder base 15a. In the component mounting work, through the feeder addresses, the component that is accommodated in carrier tape 16 installed on each tape feeder 8 is specified in feeder base 15a.

The position of carriage 15 is fixed to base 4 in component supplier 7, by clamping feeder base 15a by a clamp mechanism (not illustrated). In carriage 15, supply reel 17 that accommodates carrier tape 16 retaining the component in a state of being wound around supply reel 17 is retained. The pitch feeding of carrier tape 16 which is pulled out from supply reel 17 is performed up to the component adsorption position depending on adsorption nozzle 1 lb by tape feeder 8.

On the upper surface of the upstream side of tape feeder 8, display operator 8a is disposed. In display operator 8a, an operation button for performing a predetermined input operation by the worker, and a display for displaying a predetermined content such as a seven-segment display are disposed. The worker is capable of performing confirmation of an operation state of tape feeder 8, and an input operation of a predetermined item, by display operator 8a.

Next, component replenishment work in tape feeder 8 will be described with reference to FIG. 4. In a step of keeping a component supply by tape feeder 8, if the number of components on carrier tape 16(1) (hereinafter referred to as "precedent tape 16(1)") installed on tape feeder 8 is small, the component replenishment work of newly adding carrier tape 16(2) (hereinafter referred to as "subsequent tape 16(2)") is executed.

Figure 4:
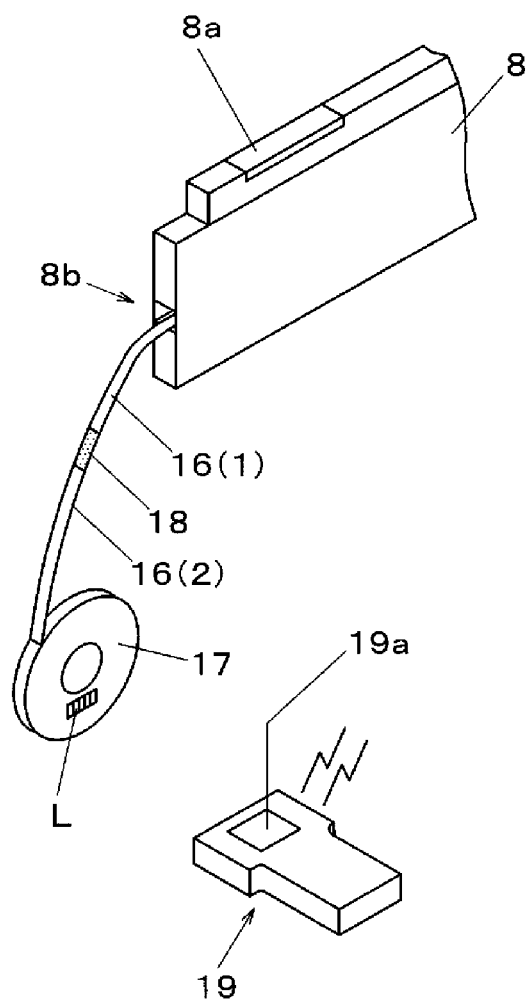
FIG. 4 is a diagram illustrating component replenishment work in a tape feeder according to an exemplary embodiment of the present invention.

In tape feeder 8 of a splicing manner illustrated in FIG. 4, the component replenishment work is executed in accordance with the splicing in which a trailing end of precedent tape 16(1), and a leading end of subsequent tape 16(2) are joined together by bonding tape 18 (splicing tape). Subsequent tape 16(2) is joined follows precedent tape 16(1) and is supplied to tape feeder 8 from tape inlet port 8b.

In FIG. 4, bar code label L is attached to each supply reel 17 in advance. When the component replenishment work is executed in tape feeder 8, bar code label L is read by bar code reader 19. A result of the reading is transmitted to management computer 3 through radio communication apparatus 40, and is further transmitted to component mounting apparatuses M2 to M4 from management computer 3, and to tape feeder 8 installed on component supplier 7 from component mounting apparatuses M2 to M4 (see FIG. 5). Bar code reader 19 includes display screen 19a, and may display the information which is transmitted from management computer 3 through radio communication apparatus 40 on display screen 19a.

Next, a configuration of a control system of component mounting line 1, and a component replenishment support system in component mounting line 1 will be described with reference to FIG. 5. Here, only management computer 3, and component mounting apparatuses M2 to M4 are described, and the description of other apparatuses will be omitted. Each of component mounting apparatuses M2 to M4 includes mounting controller 20, storage 21, substrate transport mechanism 5, component supplier 7, component mounting mechanism 12, manufacture state detection processor 24, recognition processor 25, input operator 26, and display 27. Mounting controller 20 executes the component mounting work by controlling each portion described below, based on various types of control processing programs and data which are stored in storage 21.

Mounting controller 20 has a function for controlling the operations, and controls component supplier 7, substrate transport mechanism 5, and component mounting mechanism 12, and performs the component mounting work of mounting the component pulled out from tape feeder 8 of component supplier 7 on substrate 6 of which the transport position is positioned by substrate transport mechanism 5. When the component mounting work is controlled, mounting data 22 stored in storage 21 is referred.

In the step of executing the component mounting work, a processing of detecting the manufacture state in the apparatus is performed by manufacture state detection processor 24, based on an operation monitoring function of mounting controller 20. Manufacture state detection processor 24 has manufacture state detecting functions such as a remaining component number calculating function, a component consumption rate detecting function, and a component shortage time predicting function, and a detection result is stored in storage 21 in real time as manufacture state detection data 23 including component type data 23a, remaining component number data 23b, component consumption rate data 23c, and component shortage time data 23d.

Component type data 23a is data indicating component type 16a of the component that is accommodated in carrier tape 16 installed on each tape feeder 8. Remaining component number data 23b is data indicating the number of remaining components which may be supplied in each tape feeder 8, and is added by the number of components that are accommodated in carrier tape 16 which is replenished during the component replenishment work, and is subtracted by the number of components which are consumed in the component replenishment work.

Component consumption rate data 23c indicates a component consumption rate in each tape feeder 8, that is, the number of consumed components per unit time. Component shortage time data 23d is predicted from the number of remaining components and the component consumption rate, and indicates component shortage time Ts of a case where the component shortage occurs in tape feeder 8. In other words, manufacture state detection processor 24 becomes component shortage time predictor that predicts component shortage time Ts of each tape feeder 8 (each part feeder).

As part feeder, in addition to tape feeder 8 of the splicing manner, a tape feeder of a splicingless manner which is capable of replenishing subsequent tape 16(2) without splicing may be used. Moreover, a stick feeder that supplies the component which is accommodated in a stick, or a tray feeder that supplies the component which is accommodated in a tray may be used.

Recognition processor 25 performs a recognition processing of the captured image results by component recognition camera 13, and substrate recognition camera 14. Thereby, identification and position detection of the component in a state of being retained in mounting head 11 is performed, and the position of substrate 6 that is positioned in a mounting stage of substrate transport mechanism 5 is detected. When the transport and mounting of the component is performed by mounting head 11, the position correction of the component mounting point is performed by adding the recognition results.

Input operator 26 is an input apparatus such as a touch panel or a ten key switch, and perform an input operation at the time of the data input or the operation command input. Display 27 is a display such as a touch panel, and performs the display of a predetermined item which is necessary for notification to the worker.

The notification includes the information specifying tape feeder 8 where the component shortage is predicted and a warning of component shortage time Ts, or a warning of predicting that man-hour lacks in amount of the work that may not be completed even when the component replenishment work is smoothly carried out. Each portion is connected to management computer 3 through communicator 28 and communication network 2 being interface, and thereby, transmission and reception of signals between component mounting apparatuses M2 to M4 and management computer 3 is performed.

Management computer 3 includes overall controller 30, storage 31, target feeder selector 36, virtual work end time predictor 37a, work end time predictor 37b, component shortage warning processor 38a, component shortage early warning processor 38b, countdown processor 38c, communicator 39, and radio communication apparatus 40. Overall controller 30 manages each of apparatuses configuring component mounting line 1 overall, based on the processing programs and the data which are stored in storage 31.

In storage 31, manufacture data 32, manufacture state detection data 33, worker data 34, warning start time data 35a, warning consideration start time data 35b, selection feeder data 35c, virtual work end time data 35d, and work end time data 35e are stored. Manufacture data 32 is data for executing the manufacture work of the component mounting in each apparatus, that is, the component mounting work, and includes feeder arrangement data defining the arrangement of the component that is set to tape feeder 8 in component supplier 7 of each of component mounting apparatuses M2 to M4. In component suppliers 7 which are arranged by two places in each of component mounting apparatuses M2 to M4, component supplier addresses 7a (a2f, a2r, a3f, air, a4f, a4r) specifying each of component suppliers 7 are set.

In feeder base 15a of carriage 15 which is set to component supplier 7, feeder address 7b (b1, b2, b3, . . . ) specifying the installation position of tape feeder 8 in component supplier 7 is set. By the feeder arrangement data, component type 16a (aaa, bbb, ccc, . . . ) indicating the type of the component that is supplied by tape feeder 8 installed on feeder address 7b is tied therewith. In the component mounting work, component supplier address 7a, and feeder address 7b corresponding to mounted component type 16a are designated, and thereby, tape feeder 8 which to be pulled out the component is specified.

Manufacture state detection data 23 which is obtained by component mounting apparatuses M2 to M4 and transmitted, as manufacture state detection data 23, is stored per apparatus. In manufacture state detection data 33, component shortage time Ts of each tape feeder 8 which is predicted by component mounting apparatuses M2 to M4 is included as component shortage time data 33a. Manufacture state detection data 33 is updated at a predetermined interval such as every time the component mounting to one sheet of substrate 6 is ended in component mounting apparatuses M2 to M4.

In worker data 34, proficiency 34a of each worker, charge line 34b, and work time 34c are included. Here, an example of worker data 34 will be described with reference to FIG. 6. In FIG. 6, two of proficient worker a whose proficiency 34a is "5", and new face worker b whose proficiency 34a is "1" are assigned to charge line 34b of L1, and two of middle-ranking workers c and worker d whose proficiency 34a is "3" are assigned to charge line 34b of L2. Proficiency 34a indicates that the larger the number, the higher the proficiency of the worker. Work time 34c is standard work time per one time which is necessary for the component replenishment work of replenishing carrier tape 16 in tape feeder 8, and depends on proficiency 34a of the worker. That is, work time 34c is shortened by the worker whose proficiency 34a is high.

Figure 5:
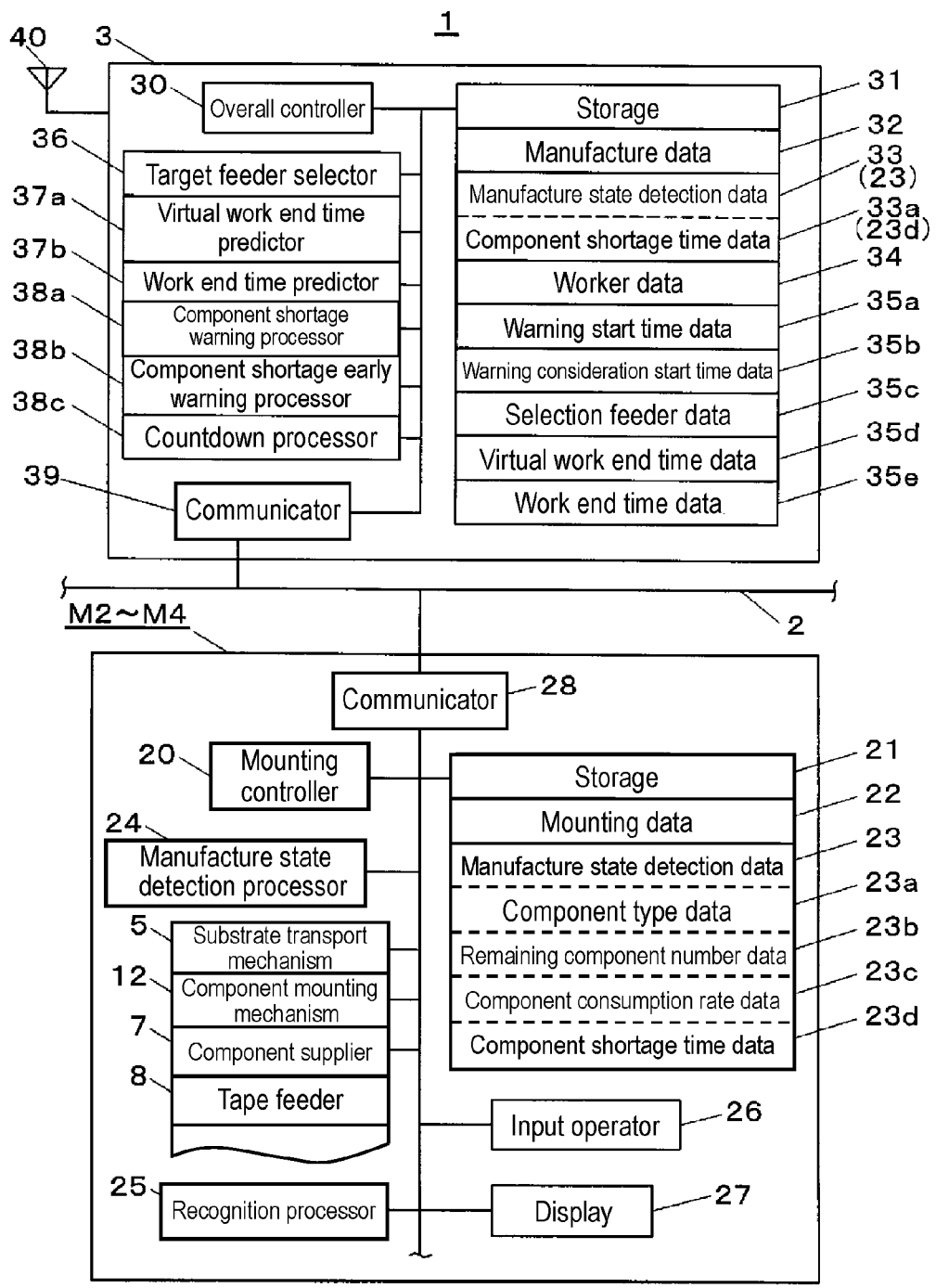
FIG. 5 is a block diagram illustrating a configuration of a control system of the component mounting line according to the exemplary embodiment of the present invention.

In FIG. 5, warning start time data 35a stores warning start time Ta1 in a case of starting the display of "normal warning" for prompting the component replenishment to tape feeder 8 in which the accommodated components are reduced, and the component replenishment work is necessary. Warning consideration start time data 35b stores warning consideration start time Ta2 preceding warning start time Ta1. Warning consideration start time Ta2 is set for the following purposes.

In a case where the number of tape feeders 8 which are close to component shortage time Ts is large, since the component replenishment work of tape feeder 8 is started from the display of "normal warning", the component shortage may occur in tape feeder 8 without ending the work. Even in such a case, it is possible to prevent a stop of component mounting line 1 due to the component shortage, by starting the component replenishment precedent to warning start time Ta1, or by performing the component replenishment work with the workers in parallel by increasing the number of workers. Therefore, warning consideration start time Ta2 is set as the time in a case of starting to consider whether or not the display of "early waxing" for prompting the early component replenishment to tape feeder 8 precedent to "normal warning", or the display of the warning of "man-hour lack" for prompting a support call of the worker is performed.

Target feeder selector 36 selects tape feeder 8 of which component shortage time Ts is between warning start time Ta1 and warnings consideration start time Ta2, as selection feeder F which becomes a consideration target of the warning of "early warning" or "man-hour lack". That is, target feeder selector 36 is a selector that selects tape feeder 8 (part feeder) of which component shortage time Ts exceeds predetermined warning start time Ta1, and is within warning consideration start time Ta2 preceding warning start time Ta1 as selection feeder F. Selected selection feeder F is stored in storage 31 as selected feeder data 35c.

Virtual work end time predictor 37a starts the component replenishment work from the present time, and predicts normal warning target feeder work end time Te1 in a case where the component replenishment work is ended in all tape feeders 8 of which component shortage time Ts is within warning start time Ta1. Virtual work end time predictor 37a compares normal warning target feeder work end-time Te1 to the time of a case where tape feeder 8 of which the occurrence of the component shortage is earliest reaches warning start time Ta1 among the selection feeders F. Virtual work end time predictor 37a starts the component replenishment work of each selection feeder F from the later time, and predicts virtual work end time Tv in a case where the component replenishment work end time of each selection feeder F is ended by assuming to perform the component replenishment work in sequence of early occurrence of the component shortage.

That is, virtual work end time predictor 37a is a first work end time predictor that starts the component replenishment work from the later time of either the time (normal warning target feeder work end time Te1) of a case where the component replenishment work is ended in all tape feeders 8 (part feeders) of which component shortage time Ts is within warning start time Ta1 by starting the component replenishment work from the present time, or the time of a case where component shortage time Ts of any selection feeder F firstly reaches warning start time Ta1, and predicts virtual work end time Tv (first component replenishment work end time) of selection feeder F in a case where the component replenishment work is assumed to be performed in sequence of early component shortage time Ts by using selection feeder F as a target. Predicted virtual work end time Tv is stored in storage 31 as virtual work end time data 35d.

Work end time predictor 37b assumes to perform the component replenishment work in sequence of early occurrence of the component shortage by starting the component replenishment work of tape feeder 8 of which component shortage time Ts is within warning consideration start time Ta2 from the present time, in a case where selection feeder F of which the occurrence of the component shortage is earlier than virtual work end time Tv is present, and predicts work end time Te in a case where the component replenishment work of each of tape feeder 8 is ended.

In other words, work end time predictor 37b is a second work end time predictor that starts the component replenishment work from the present time in a case where selection feeder F of which component shortage time Ts is earlier than virtual work end time Tv (first component replenishment work end time) is present, and predicts work end time Te (second component replenishment work end time) of selection feeder F in a case where the component replenishment work is assumed to be performed in sequence of early component shortage time Ts by using tape feeder 8 (part feeder) of which component shortage time Ts is within warning consideration start time Ta2 as a target. Predicted work end time Te is stored in storage 31 as work end time data 35e.

When virtual work end time predictor 37a, and work end time predictor 37b calculate virtual work end time Tv, and work end time Te, charge line 34b, proficiency 34a, and work time 34c of each worker of worker data 34 are referred. That is, the number of workers who are capable of performing the component replenishment work in component mounting line 1, and proficiency 34a of each worker are referred. Accordingly, it is possible to predict virtual work end time Tv and work end time Te more accurately. In this manner, virtual work end time Tv (first component replenishment work end time), and work end time Te (second component replenishment work end time) are based on the number of workers who perform the component replenishment work, and proficiency 34a.

Component shortage warning processor 38a displays "normal warning" for prompting the component replenishment of tape feeder 8 on display 27 of component mounting apparatuses M2 to M4, in a case where tape feeder 8 of which component shortage time Ts is within warning start time Ta1 is present.

Component shortage early warning processor 38b displays "early warning" for prompting early component replenishment of selection feeder F of which work end time Te is within warning start time Ta1 on display 27 of component mounting apparatuses M2 to M4, in a case where selection feeder F of which component shortage time Ts is earlier than work end time Te is not present. In this manner, component shortage early warning processor 38b displays the target of "early warning" by being limited to selection feeder F of which work end time Te is within warning start time Ta1. Therefore, it is possible to enhance work efficiency by reducing the time which is spent in grasp of the situation by the worker.

Component shortage early warning processor 38b displays "early waring" for prompting early component replenishment of selection feeder F of which component shortage time Ts is later than work end time Te on display 27 of component mounting apparatuses M2 to M4, in a case where selection feeder F of which component shortage time Ts is earlier than work end time Te is present. That is, component shortage early warning processor 38b is a second warner that warns the component replenishment to selection feeder F of which component shortage time Ts is later than work end time Te by displaying the component replenishment on display 27, in the case where selection feeder F of which component shortage time Ts is earlier than work end time Te (second component replenishment work end time) is present.

In this manner, second warner displays all selection feeders F of which component shortage time Ts is later than work end time Te, that is, all selection feeders F of which the occurrence of the component shortage is earlier than selection feeder F that becomes the warning target of "man-hour lack" described below, as a target of "early waring". Therefore, until the supporting workers who are aware of the warning of "man-hour lack" will come from other component mounting lines 1, it is possible to execute more component replenishment work than ever by the workers of component mounting line 1, and it is possible to enhance the possibility of avoiding the stop of component mounting line 1 due to the component shortage.

Component shortage early warning processor 38b displays the warning of "man-hour lack" of predicting that the component replenishment work may not be completed even when the component replenishment work is smoothly carried out up to selection feeder F on display 27 of component mounting apparatuses M2 to M4, in the case where selection feeder F of which component shortage time Ts is earlier than work end time Te is present.

That is, component shortage early warning processor 38b is a first warner that warns the man-hour lack to selection feeder F by displaying the man-hour lack on display 27, in a case where selection feeder F of which component shortage time Ts is earlier than work end time Te (second component replenishment work end time) is present. Accordingly, the worker of component mounting line 1 can easily recognize the need to ask the support of the workers who afford to work in other component mounting lines 1.

Countdown processor 38c displays countdown time Tc until "normal warning" or "early warning" occurs on display 27 of component mounting apparatuses M2 to M4, in a case where tape feeder 8 which becomes "normal warning" or "early warning" is not present. That is, countdown processor 38c displays the shortest time of normal warning start reach time Tb1 until component shortage time Ts of tape feeder 8 reaches warning start time Ta1 and early warning start reach time Tb2 until component shortage time Ts of selection feeder F reaches virtual work end time Tv, as countdown time Tc, in a case where tape feeder 8 of which component shortage time Ts is within warning start time Ta1 is not present, and selection feeder F of which component shortage time Ts is earlier than virtual work end time Tv is not present.

Communicator 39 is an interface, and performs the transmission and reception of the signals between component mounting apparatuses M2 to M4 through communication network 2. Radio communication apparatus 40 receives the information of bar code label L from bar code reader 19, and transmits the notification information from management computer 3 to bar code reader 19.

Next, a component replenishment support method (component replenishment support processing) in component mounting line 1 according to the exemplary embodiment will be described with reference to FIG. 9 to FIG. 13B in line with flows of FIG. 7 and FIG. 8. In FIG. 9 to FIG. 12, tape feeders 8 installed on component mounting apparatuses M2 to M4 are rearranged in sequence of early component shortage time Ts, and are displayed by attaching the numerals for the description thereto. In the following description, each tape feeder 8 of FIG. 9 to FIG. 12 is displayed as "tape feeder 8 (numeral for description)" by using the numeral for description.

First, in component mounting apparatuses M2 to M4, manufacture state detection processor 24 predicts component shortage time Ts of each tape feeder 8 (each part feeder) (ST1: component shortage time prediction step). Predicted component shortage time Ts is stored as component shortage time data 33a by being transmitted to storage 31 of management computer 3. Next, in management computer 3, component shortage warning processor 38a determines whether or not tape feeder 8 is tape feeder 8 of which component shortage time Ts is within warning start time Ta1 (ST2).

In a case where tape feeder 8 is tape feeder 8 of which component shortage time Ts is within warning start time Ta1 (Yes in ST2), component shortage warning processor 38a displays "normal warning" for prompting the component replenishment of tape feeder 8 on display 27 (ST3: component shortage normal warning step).

Figure 10:
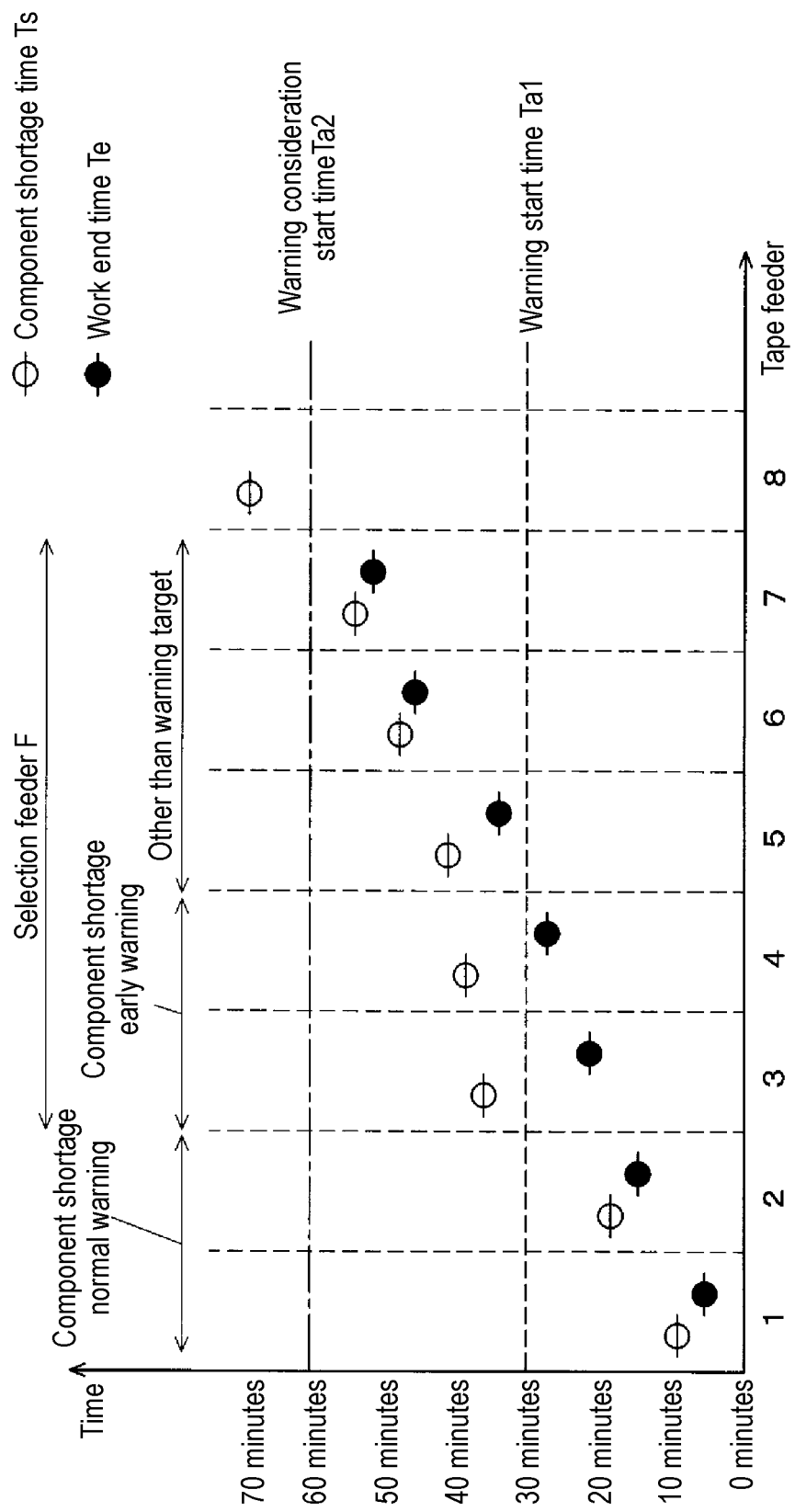
FIG. 10 is a diagram illustrating the component replenishment support processing in the component mounting line according to the exemplary embodiment of the present invention.
Figure 11:
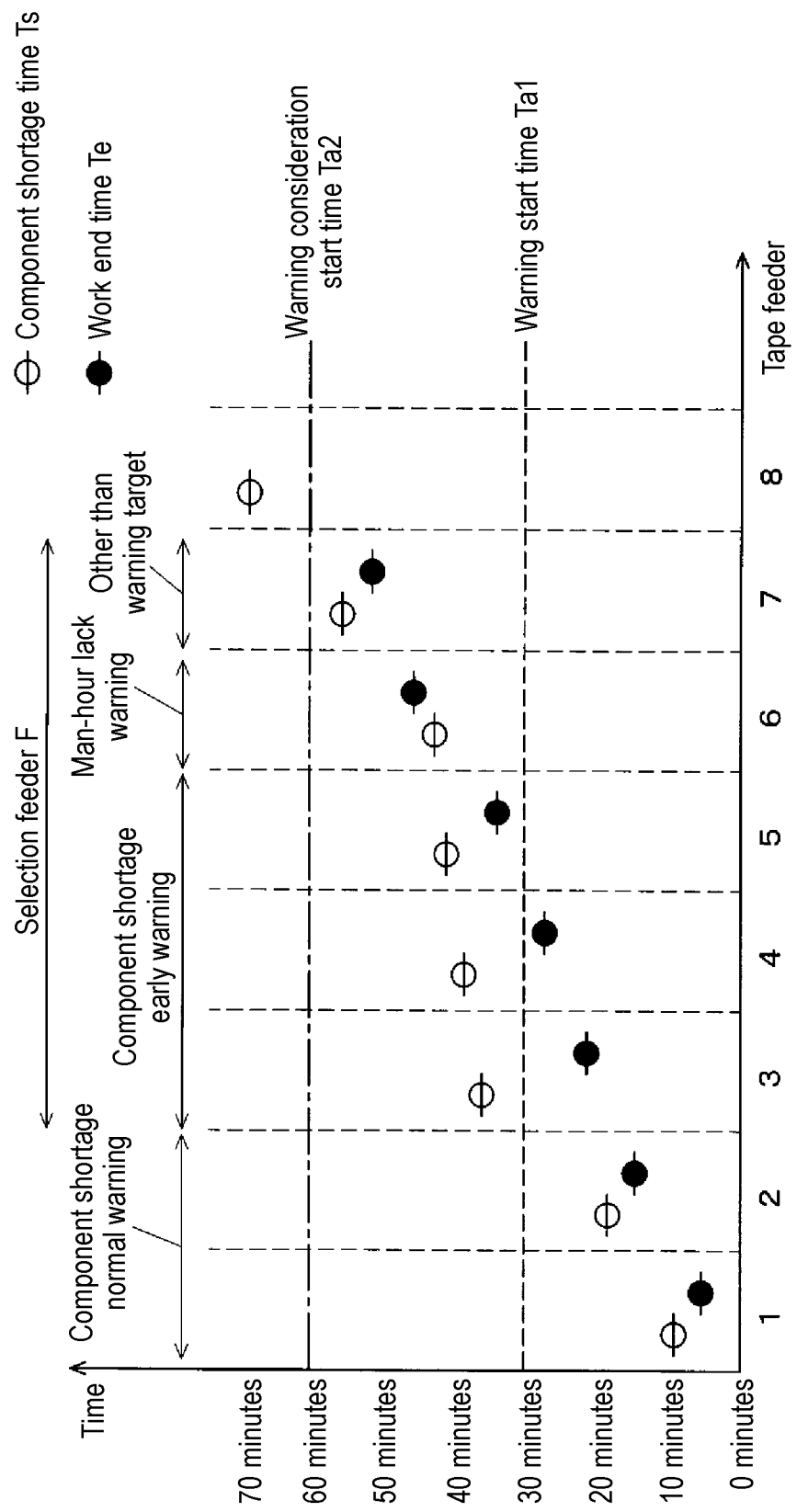
FIG. 11 is a diagram illustrating the component replenishment support processing in the component mounting line according to the exemplary embodiment of the present invention.
Figures 13A, 13B:
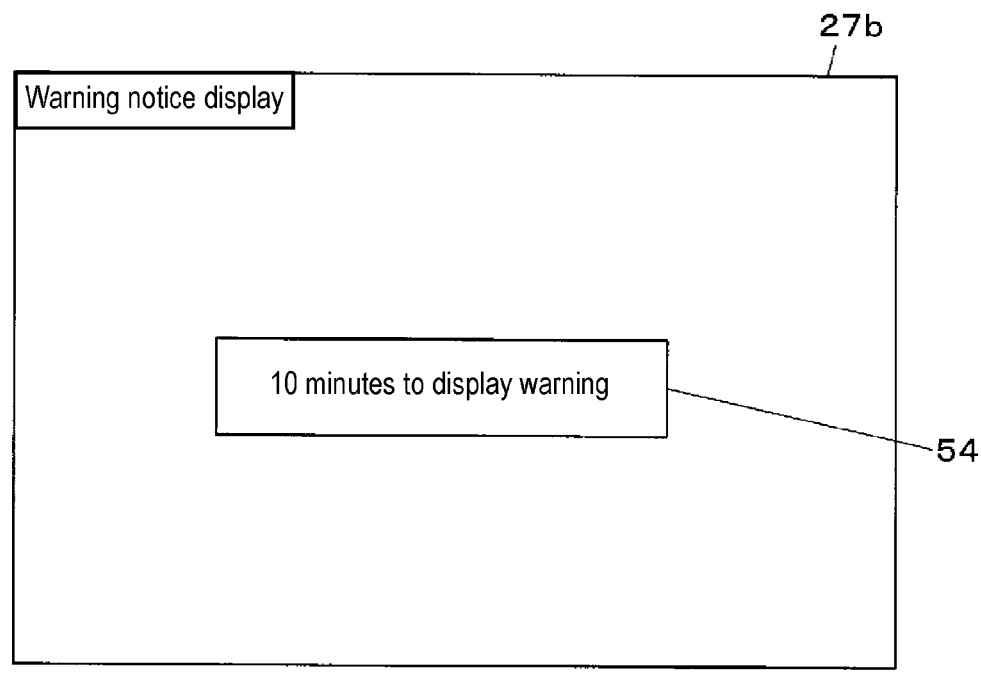
FIG. 13A is a diagram illustrating a warning display screen in the component replenishment support processing in the component mounting line according to the exemplary embodiment of the present invention.
FIG. 13B is a diagram illustrating a warning notice display screen, in the component replenishment support processing in the component mounting line according to the exemplary embodiment of the present invention.

In FIG. 10 and FIG. 11, tape feeders 8(1) and 8(2) of which component shortage time Ts is within 30 minutes of warning start time Ta1 become the targets of the component shortage normal warning FIG. 13A illustrates an example of the warning display which is displayed on display 27 of component mounting apparatuses M2 to M4. On warning display screen 27a, in response to tape feeder 8 which becomes the warning target, the warning content, component supplier address 7a, feeder address 7b, component type 16a, and component shortage time Ts are displayed.

In FIG. 13A, tape feeders 8(1) and 8(2) of FIG. 10 and FIG. 11 are displayed as tape feeder 8 of the component shortage normal waring target. In other words, tape feeder 8(1) is displayed as tape feeder 8 of the component shortage normal waning target in which component supplier address 7a is a2f, and feeder address 7b is b8. Tape feeder 8(2) is displayed as tape feeder 8 of the component shortage normal waning target in which component supplier address 7a is a4f, and feeder address 7b is b3.

Figure 7:
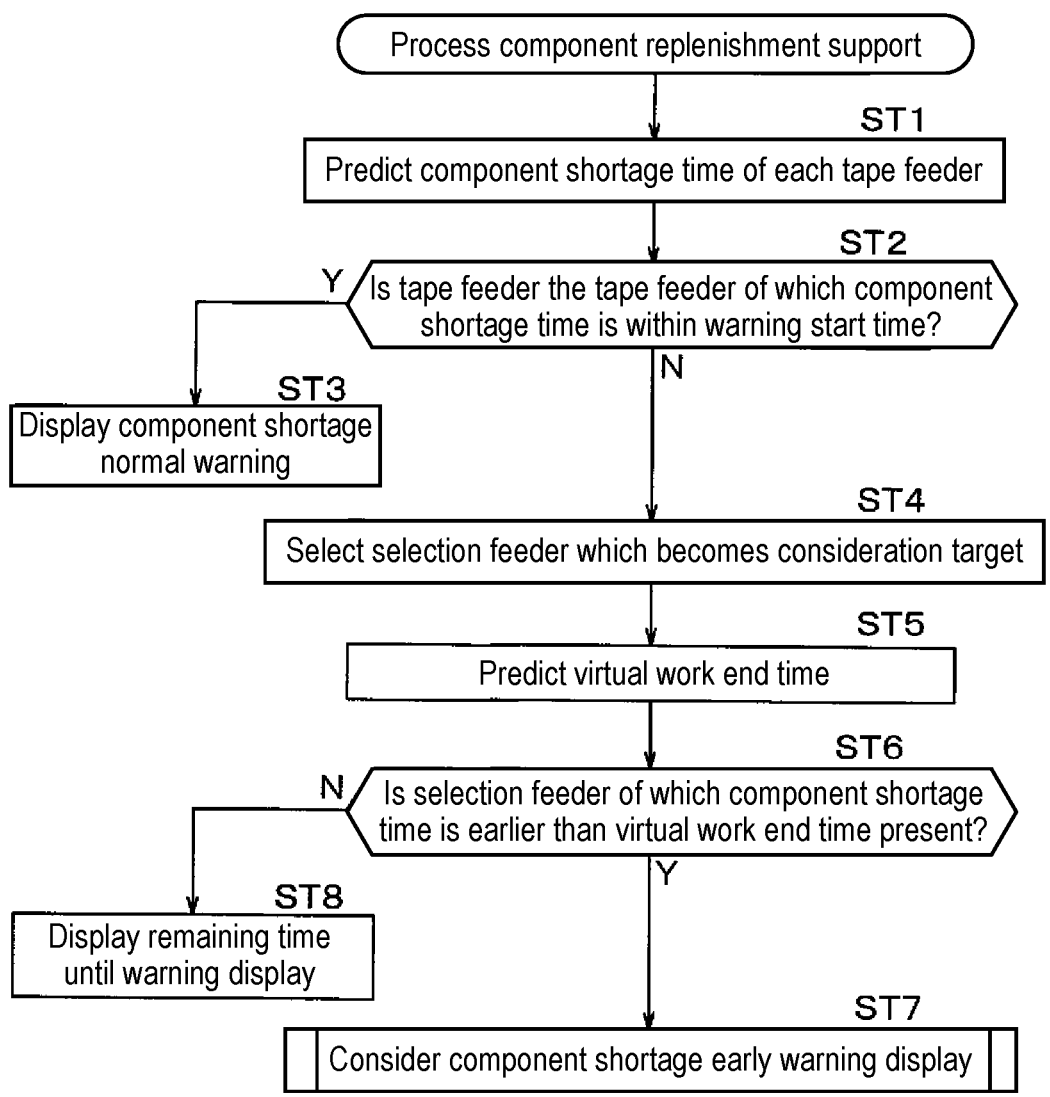
FIG. 7 is a flowchart illustrating a component replenishment support processing in the component mounting line according to the exemplary embodiment of the present invention.
Figure 9:
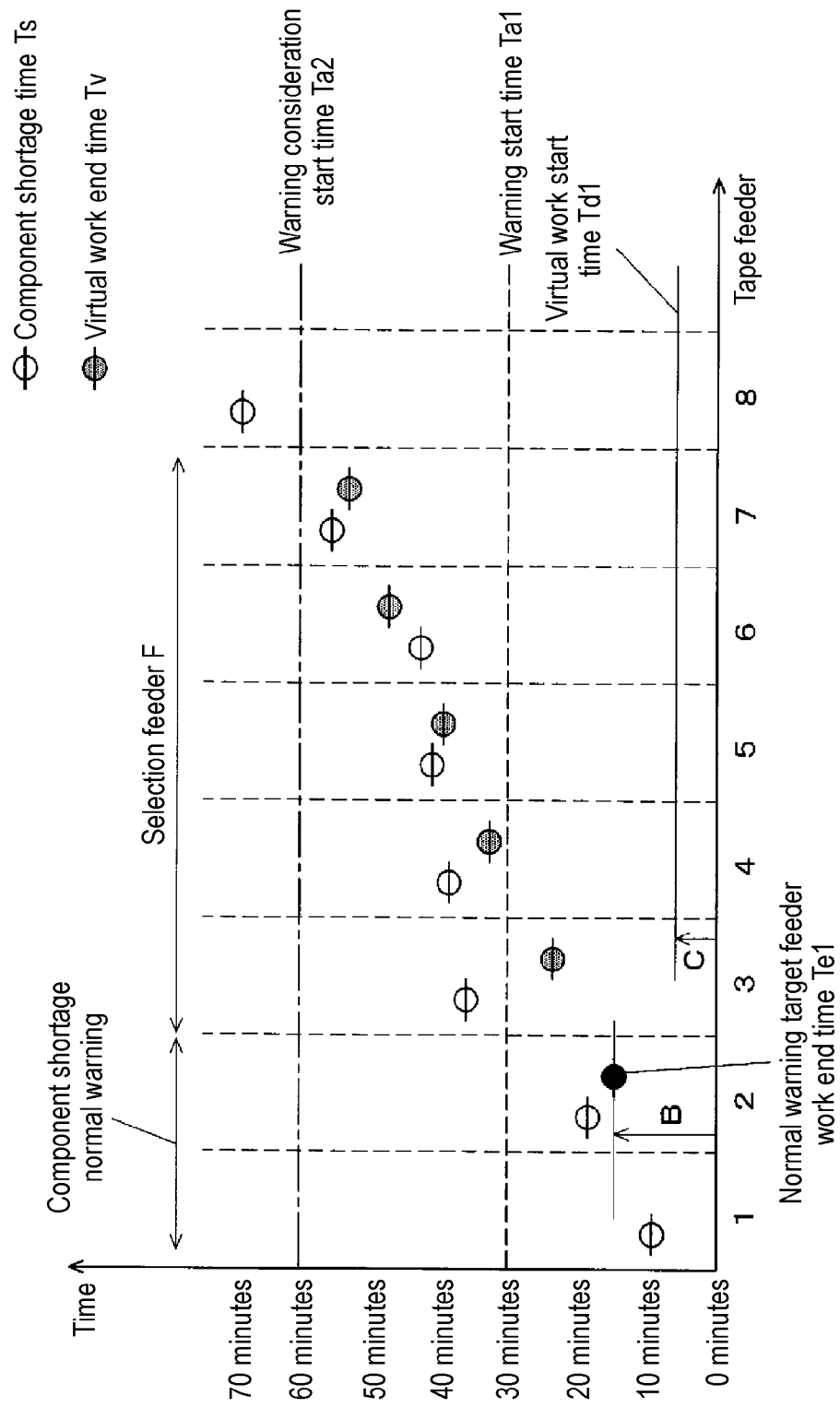
FIG. 9 is a diagram illustrating the component replenishment support processing in the component mounting line according to the exemplary embodiment of the present invention.

In FIG. 7, in a case where tape feeder 8 is not tape feeder 8 of which component shortage time Ts is within warning start time Ta1 (No in ST2), target feeder selector 36 selects tape feeder 8 (part feeder) of which component shortage time Ts exceeds predetermined warning start time Ta1, and is within warning consideration start time Ta2 preceding warning start time Ta1 as selection feeder F (ST4: selection step). In the example of FIG. 9, tape feeders 8(3) to 8(7) of which component shortage time Ts are between warning start time Ta1 (30 minutes) and warning consideration start time Ta2 (60 minutes) are selected as selection feeder F.

Next, virtual work end time predictor 37a starts the component replenishment work from the later time of either the time (normal warning target feeder work end time Te1) of the case where the component replenishment work is ended in all tape feeders 8 (part feeders) of which component shortage time Ts is within warning start time Ta1 by starting the component replenishment work from the present time, or the time of the case where component shortage time Ts of any selection feeder F firstly reaches warning start time Ta1, and predicts virtual work end time Tv (first component replenishment work end time) of selection feeder F in the case where the component replenishment work is assumed to be performed in sequence of early component shortage time Ts by using selection feeder F as a target (ST5: virtual work end time prediction step (first work end time prediction step)).

In FIG. 9, tape feeder 8 of which component shortage time Ts is within warning start time Ta1, and which becomes the target of the component shortage normal warning is assumed that the component replenishment work is performed in sequence of early component shortage time Ts. In this case, 15 minutes (B of FIG. 9) of a case where the component replenishment work is ended in tape feeder 8(2) of which component shortage time Ts is slowest becomes normal warning target feeder work end time Te1. 5 minutes (C of FIG. 9) of a case where component shortage time Ts (35 minutes) exceeds warning start time Ta1 (30 minutes) in tape feeder 8(3) of which the occurrence of the component shortage is earliest among selection feeders F becomes virtual work start time Td1.

In the virtual work end time prediction step (ST5), normal warning target feeder work end time Te1 (15 minutes) is compared with virtual work start time Td1 (5 minutes), and the component replenishment work of each selection feeder F is assumed to be started from the later time. In the example of FIG. 9, virtual work end time Tv is predicted by assuming to start the component replenishment work of each selection feeder F later from 15 minutes being normal warning target feeder work end time Te1.

Next, component shortage early warning processor 38b determines whether or not selection feeder F of which component shortage time Ts is earlier than virtual work end time Tv is present (ST6). In a case where selection feeder F of which component shortage time Ts is earlier than virtual work end time Tv is present (Yes in ST6), component shortage early warning processor 38b considers that tape feeder 8 which becomes the target of the component shortage early warning display is present (ST7). In FIG. 9, since component shortage time Ts is earlier than virtual work end time Tv in tape feeder 8(6), the consideration of the component shortage early warning display in (ST7) is performed by determining the case of Yes in (ST6).

Figure 8:
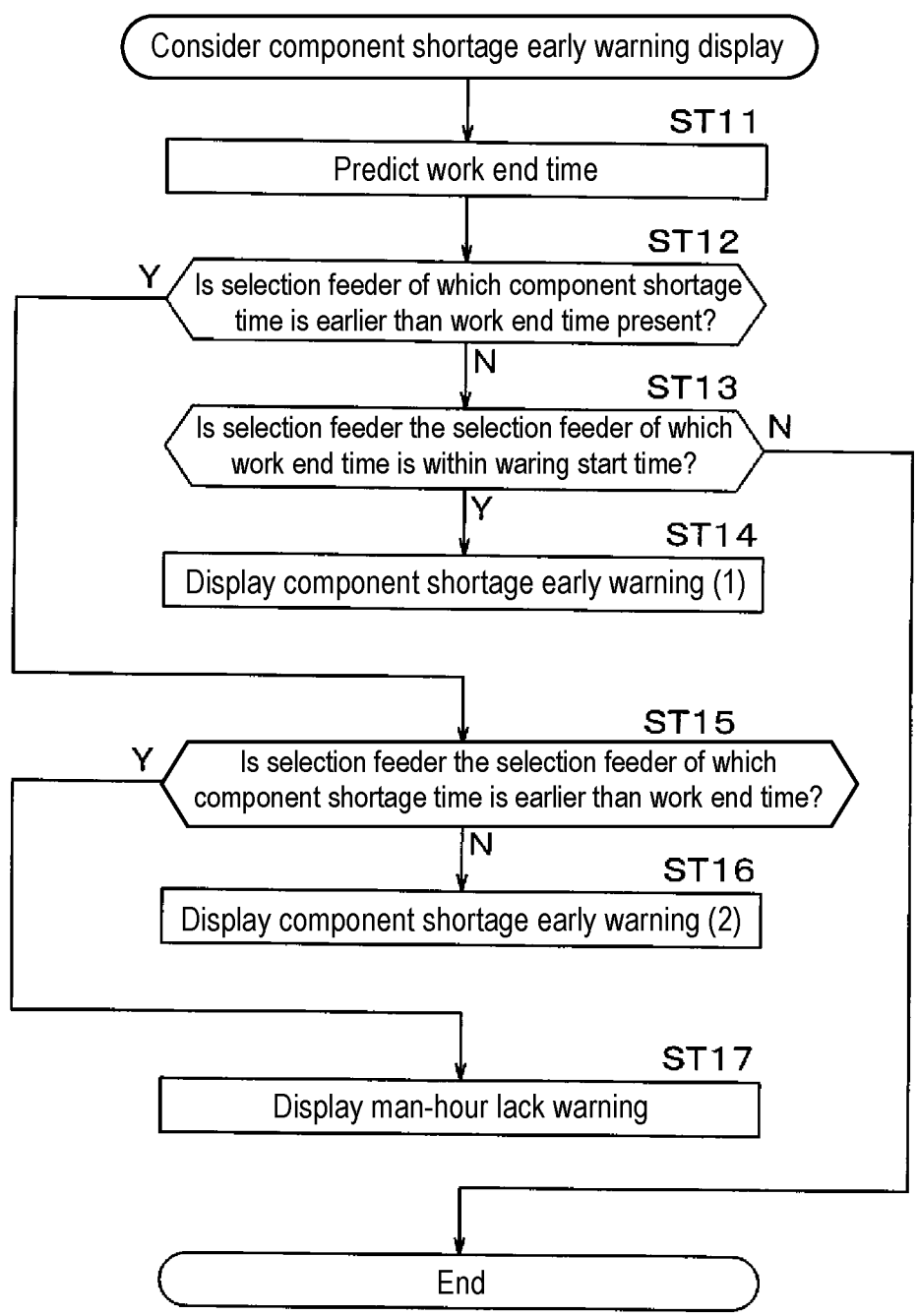
FIG. 8 is a flowchart illustrating consideration of a component shortage early warning display of the component replenishment support processing in the component mounting line according to the exemplary embodiment of the present invention.

FIG. 8 illustrates a detailed flow of the consideration of the component shortage early warning display of (ST7) in the component replenishment support processing. In the consideration of the component shortage early warning display, first, work end time predictor 37b assumes to perform the component replenishment work in sequence of early occurrence of the component shortage by starting the component replenishment work of tape feeder 8 of which component shortage time Ts is within warning consideration start time Ta2 from the present time, and predicts work end time Te in the case where the component replenishment work of each tape feeder 8 is ended (ST11: work end time prediction step).

That is, the work end time prediction step (ST11) in the case of Yes in (ST6) proceeds to a second work end time prediction step of starting component replenishment work from the present time in a case where selection feeder F of which component shortage time Ts is earlier than virtual work end time Tv (first component replenishment work end time) is present, and predicting work end time Te (second component replenishment work end time) of selection feeder F in a case where the component replenishment work is assumed to be performed in sequence of early component shortage time Ts by using tape feeder 8 (part feeder) of which component shortage time Ts is within warning consideration start time Ta2 as a target.

Next, component shortage early warning processor 38b determines whether or not selection feeder F of component shortage time Ts is earlier than work end time Te is present (ST12). In FIG. 10, in tape feeders 8(3) to 8(7) which are selection feeders F, since tape feeder 8 of component shortage time Ts is earlier than work end time Te is not present, No in (ST12) is determined.

In a case where selection feeder F of component shortage time Ts is earlier than work end time Te is not present (No in ST12), component shortage early warning processor 38b determines whether or not selection feeder F is selection feeder F of work end time Te is within warning start time Ta1 (ST13). In a case where selection feeder F is selection feeder F of work end time Te is within warning start time Ta1 (Yes in ST13), component shortage early warning processor 38b displays "early warning" for prompting early component replenishment of selection feeder F of which work end time Te is withint warning start time Ta1 on display 27 (ST14: first component shortage early warning step).

In the example of FIG. 10, tape feeders 8(3) and 8(4) of which work end time Te is within warning start time Ta1 become the component shortage early warning targets. In FIG. 13A, tape feeders 8(3) and 8(4) of FIG. 10 are respectively displayed as tape feeder 8 of the component shortage early waning target in which component supplier address 7a is a2r and feeder address 7b is b5, and component supplier address 7a is a3f and feeder address 7b is b1.

In FIG. 8, in a case where selection feeder F is not selection feeder F of work end time Te is within warning start time Ta1 (No in ST13), the warning is not displayed as tape feeder 8 other than the warning target. In FIG. 10, tape feeders 8(5) to 8(7) being selection feeders F of which work end time Te is not within warning start time Ta1 are determined as tape feeders 8 other than the warning target.

In FIG. 8, in a case where selection feeder F of which component shortage time Ts is earlier than work end time Te is present (Yes in ST12), component shortage early warning processor 38b determines whether or not selection feeder F is selection feeder F of which component shortage time Ts is earlier than work end time Te (ST15). In a case where selection feeder F is not selection feeder F of which component shortage time Ts is earlier than work end time Te (No in ST15), component shortage early warning processor 38b displays "early warning" for prompting early component repleshiment of selection feeder F on display 27 (ST16: second component shortage early warning step).

That is, the second component shortage early warning step (ST16) in the case of No in (ST15) proceeds to a second warning step of warning the component replenishment to selection feeder F of which component shortage time Ts is later than work end time Te by displaying the component replenishment on display 27, in a case where selection feeder F of which component shortage time Ts is earlier than work end time Te (second component replenishment work end time) is present.

In the example of FIG. 11, since component shortage time Ts is earlier than work end time Te in tape feeder 8(6) being selection feeder F, Yes in (ST12) is determined. Tape feeders 8(3) to 8(5) being selection feeders F of which component shortage time Ts is later than work end time Te become component shortage early warning targets. In FIG. 13A, tape feeders 8(3) to 8(5) of FIG. 11 are displayed as tape feeder 8 of the component shortage early waning target.

In FIG. 8, in a case where selection feeder F is selection feeder F of which component shortage time Ts is earlier than work end time Te (Yes in ST15), component shortage early warning processor 38b displays the warning of "man-hour lack" of predicting that the component replenishment work may not be completed even when the component replenishment work is smoothly carried out up to selection feeder F on display 27 (ST17: man-hour lack warning step). That is, man-hour lack warning step (ST17) is a first warning step of warning the man-hour lack to selection feeder F by displaying the man-hour lack on display 27, in a case where selection feeder F of which component shortage time Ts is earlier than work end time Te (second component replenishment work end time) is present.

In FIG. 11, tape feeder 8(6) of which component shortage time Ts is earlier than work end time Te becomes the man-hour lack warning target. In FIG. 13A, tape feeder 8(6) of FIG. 11 is displayed as tape feeder 8 of the man-hour lack waning target.

As described above, in the warning display of FIG. 13A, the information of tape feeder 8 which becomes the target of the normal warning, the early warning (second warning), and the man-hour lack warning (first warning) is displayed on warning display screen 27a. The displays of the normal warning surrounded by two-dot chain line 51, the early warning surrounded by two-dot chine line 52, and the man-hour lack warning surrounded by two-dot chain line 53 are displayed so as to be visually differentiated from each other, by changing colors of fonts, or performing flickering.

In other words, the normal warning of component shortage warning processor 38a, the early warning of component shortage early warning processor 38b (second warner), and the man-hour lack warning of component shortage early warning processor 38b (first warner) are displayed on display 27 so as to be visually differentiated from each other. Accordingly, the worker can easily recognize the state of tape feeder 8 of which the component replenishment work is necessary in component mounting line 1.

In FIG. 13A, component shortage warning processor 38a, and component shortage early warning processor 38b (first warner and second warner) display component shortage time Ts of tape feeder 8 (part feeder) to be warned on display 27. Accordingly, the worker can determine the sequence of the component replenishment work of tape feeder 8 while referring to component shortage time Ts, and can efficiently execute the component replenishment work.

The warning display may be displayed on display screen 19a of bar code reader 19 through radio communication apparatus 40. Thereby, even a worker who is apart from component mounting line 1 can be aware of component shortage time Ts of tape feeder 8 of the warning target. Moreover, the display of the man-hour lack warning is displayed on display screen 19a of bar code reader 19 of the workers other than the worker in charge of component mounting line 1, and thereby, it is possible to ask the support of the workers who afford to work.

In FIG. 7, in a case where selection feeder F of which component shortage time Ts is earlier than virtual work end time Tv is not present (No in ST6), countdown processor 38c displays countdown time Tc which is the remaining time until the normal warning display or the early warning display occurs in tape feeder 8, on display 27 of component mounting apparatuses M2 to M4 (ST8).

Figure 12:
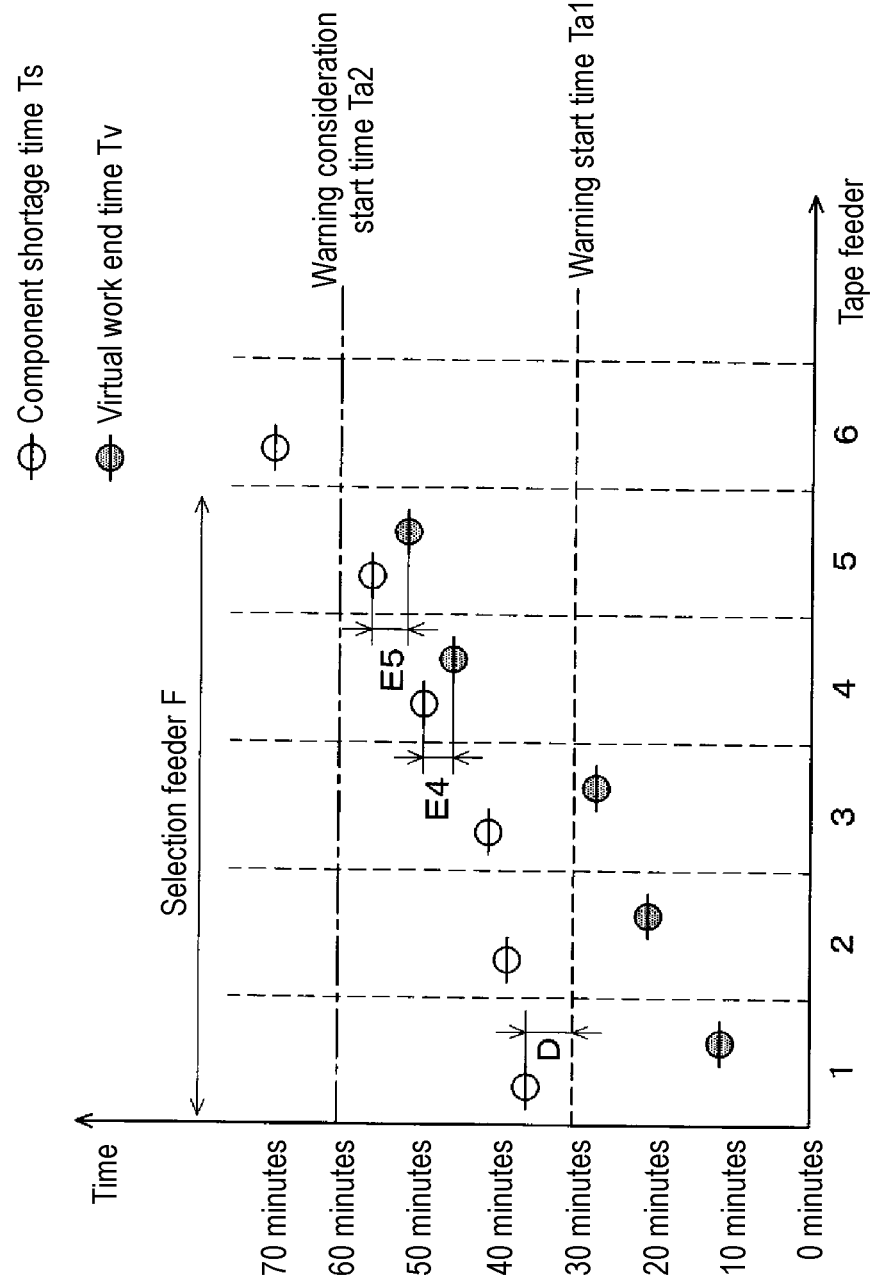
FIG. 12 is a diagram illustrating the component replenishment support processing in the component mounting line according to the exemplary embodiment of the present invention.

In the example of FIG. 12, component shortage time Ts is later than virtual work end time Tv in all selection feeders F. In this case, normal warning start reach time Tb1 (D of FIG. 12) until component shortage time Ts of tape feeder 8(1) of which the occurrence of the component shortage is earliest reaches warning start time Ta1 among the selection feeders F is calculated. Moreover, early warning start reach time Tb2 (E4, E5 or the like of FIG. 12) until component shortage time Ts of each selection feeder F reaches virtual work end time Tv is calculated. The shortest time of normal warning start reach time Tb1 and early warning start reach time Tb2 is referred to as countdown time Tc.

As illustrated in FIG. 13B, until display 27 is switched into warning display screen 27a illustrated in FIG. 13A of a case where countdown time Tc becomes zero, comment 54 including countdown time Tc (10 minutes) is displayed as warning notice display screen 27b. Accordingly, the worker can be aware of the spare time until the component replenishment work is started, and can execute the work such as the transport or cleaning work of the replenishment component in component mounting line 1 in charge, and the work such as the support of the component replenishment work in component mounting line 1 other than the charge line while referring to the spare time.

The above component replenishment support processings (ST1 to ST17) are the steps of keeping the component mounting work in component mounting apparatuses M2 to M4, and are repeatedly carried out, for example, every time the component mounting of one sheet of substrate 6 is ended. In tape feeder 8 where component replenishment work is completed, the number of remaining components is added depending on the number of replenished components, and component shortage time Ts is removed from a list of warning display screen 27a in order to greatly increase component shortage time Ts. The worker can efficiently perform the component replenishment work by referring to the latest information in component mounting line 1.

As described above, by virtual work start time Td1, component shortage time Ts of selection feeder F being a display candidates of the component shortage early warning may be considered. Moreover, by normal warning target feeder work end time Te1, the component replenishment work time of tape feeder 8 of which component shortage time Ts preceding selection feeder F is within warning start time Ta1 may be considered. Accordingly, by using virtual work end time Tv that is predicted by considering both of normal warning target feeder work end time Te1 and virtual work start time Td1 in determining whether or not the consideration of the component shortage early warning display is necessary, the following effects are obtained.

For example, if the number of tape feeders 8 preceding selection feeder F is large, the spare of normal warning target feeder work end time Te1 to warning start time Ta1 is reduced. Even in such a state, if it is determined whether or not the consideration of component shortage early warning display is necessary only in virtual work start time Td1, early beginning of the component replenishment work of selection feeder F is determined to be unnecessary in a case where the spare is present in virtual work start time Td1. In the exemplary embodiment, since both of normal warning target feeder work end time Te1 and virtual work start time Td1 are considered, even in such a state, it is possible to suitably determine whether or not the consideration of early beginning of the component replenishment work of selection feeder F is necessary, and it is possible to avoid the occurrence of the component shortage by prompting the component replenishment at an early stage.

As described above, in the component replenishment support method, and the component replenishment support system in the component mounting line according to the exemplary embodiments, component shortage time Ts of each tape feeder 8 (each part feeder) is predicted, and tape feeder 8 of which component shortage time Ts exceeds predetermined warning start time Ta1, and is within warning consideration start time Ta2 preceding warning start time Ta1 is selected as selection feeder F. The component replenishment work is started from the later time of either the time of the case where the component replenishment work is ended in all tape feeders 8 of which component shortage time Ts is within warning start time Ta1, or the time of the case where component shortage time Ts of any selection feeder F firstly reaches warning start time Ta1, and virtual work end time Tv (first component replenishment work end time) of selection feeder F is predicted in the case where the component replenishment work is assumed to be performed in sequence of early component shortage time Ts by using selection feeder F as a target.

In the case where selection feeder F of which component shortage time Ts is earlier that virtual work end time Tv is present, and work end time Te (second component replenishment work end time) of selection feeder F is predicted by starting the component replenishment work from the present time in the case where the component replenishment work is assumed to be performed in sequence of early component shortage time Ts by using tape feeder 8 of which component shortage time Ts is within warning consideration start time Ta2 as a target. In the case where selection feeder F of which component shortage time Ts is earlier that work end time Te is present, the worker is warned or the man-hour lack to selection feeder F.

Accordingly, even in a case where the number of tape feeders 8 where the component shortage occurs is large, the worker can notice the amount (man-hour lack) of the work that may not be completed even when the work is smoothly carried out at an early stage. It is possible to previously prevent the apparatus stop due to the component shortage by asking the support to the worker in charge of other lines such as the increase of the working man-hour and it is possible to prevent a decrease in facility operation rate due to the occurrence of the component shortage in component mounting line 1.

The component replenishment support method, and the component replenishment support system in the component mounting line according to the exemplary embodiments of the present invention have effects of preventing the decrease in facility operation rate due to the occurrence of the component shortage in the component mounting line, and are useful in the component mounting field where the transport and mounting of the component is performed on the substrate by pulling out the component from the part feeder disposed on the component supplier.

What is claimed is:

1. A component replenishment support method in a component mounting line including a component mounting apparatus that pulls out a component supplied from a plurality of part feeders and mounts the component on a substrate, the method comprising:
    a component shortage time prediction step of predicting a component shortage time of each of the plurality of part feeders;
    a selection step of selecting a part feeder of which the component shortage time exceeds a predetermined warning start time, and is within a warning consideration start time preceding the warning start time as at least one selection feeder, from the plurality of part feeders;
    a first work end time prediction step of starting component replenishment work from the later time of either a time at which the component replenishment work is ended in all of the part feeders of which the component shortage time is within the warning start time after a start of the component replenishment work from the present time, or an overtime of a case where the component shortage time of any of the at least one selection feeder exceeds a time at which the component shortage time firstly reaches the warning start time, and predicting a first component replenishment work end time of the at least one selection feeder in a case where the component replenishment work is assumed to be performed in sequence of early component shortage time by using the at least one selection feeder as a target;
    a second work end time prediction step of starting component replenishment work from the present time in a case where the at least one selection feeder of which the component shortage time is earlier than the first component replenishment work end time is present, and predicting a second component replenishment work end time of the at least one selection feeder in a case where the component replenishment work is assumed to be performed in sequence of early component shortage time by using the part feeder of which the component shortage time is within the warning consideration start time as a target; and
    a first warning step of warning a man-hour lack to the at least one selection feeder, in a case where the at least one selection feeder of which the component shortage time is earlier than the second component replenishment work end time is present.

2. The component replenishment support method in a component mounting line of claim 1,
    wherein the first component replenishment work end time, and the second component replenishment work end time are based on the number of workers who perform the component replenishment work.

3. The component replenishment support method in a component mounting line of claim 1, the method further comprising:
    a second warning step of warning a component replenishment to the at least one selection feeder of which the component shortage time is later than the second component replenishment work end time, in a case where the at least one selection feeder of which the component shortage time is earlier than the second component replenishment work end time is present,
    wherein the warning of the first warning step, and the warning of the second warning step are displayed to be visually differentiated from each other.

4. The component replenishment support method in a component mounting line of claim 3,
    wherein in the first warning step or the second warning step, the component shortage time of a warning target part feeder is displayed.

5. A component replenishment support system in a component mounting line including a component mounting apparatus that pulls out a component supplied from a plurality of part feeders and mounts the component on a substrate, the system comprising:
    a component shortage time predictor that predicts a component shortage time of each of the plurality of part feeders;
    a selector that selects a part feeder of which the component shortage time exceeds a predetermined warning start time, and is within a warning consideration start time preceding the warning start time as at least one selection feeder, from the plurality of part feeders;
    a first work end time predictor that starts component replenishment work from the later time of either a time at which the component replenishment work is ended in all of the part feeders of which the component shortage time is within the warning start time after a start of the component replenishment work from the present time, or an overtime of a case where the component shortage time of any of the at least one selection feeder exceeds a time at which the component shortage time firstly reaches the warning start time, and predicts a first component replenishment work end time of the at least one selection feeder in a case where the component replenishment work is assumed to be performed in sequence of early component shortage time by using the at least one selection feeder as a target;

a second work end time predictor that starts component replenishment work from the present time in a case where the at least one selection feeder of which the component shortage time is earlier than the first component replenishment work end time is present, and predicts a second component replenishment work end time of the at least one selection feeder in a case where the component replenishment work is assumed to be performed in sequence of early component shortage time by using the part feeder of which the component shortage time is within the warning consideration start time as a target; and a first warner that warns a man-hour lack to the at least one selection feeder, in a case where the at least one selection feeder of which the component shortage time is earlier than the second component replenishment work end time is present.

6. The component replenishment support system in a component mounting line of claim 5, wherein the first component replenishment work end time, and the second component replenishment work end time are based on the number of workers who perform the component replenishment work.

7. The component replenishment support system in a component mounting line of claim 5, the system further comprising:

a second warner that warns a component replenishment to the at least one selection feeder of which the component shortage time is later than the second component replenishment work end time, in a case where the at least one selection feeder of which the component shortage time is earlier than the second component replenishment work end time is present, wherein the warning of the first warner, and the warning of the second warner are displayed to be visually differentiated from each other.

8. The component replenishment support system in a component mounting line of claim 7, wherein the first warner or the second warner displays the component shortage time of a warning target part feeder.

\* \* \* \* \*